US008036056B2

(12) United States Patent
Lee

(10) Patent No.: US 8,036,056 B2
(45) Date of Patent: Oct. 11, 2011

(54) SEMICONDUCTOR MEMORY DEVICE AND METHOD OF INPUTTING AND OUTPUTTING DATA IN THE SEMICONDUCTOR MEMORY DEVICE

(75) Inventor: Soon-Seob Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 476 days.

(21) Appl. No.: 12/232,719

(22) Filed: Sep. 23, 2008

(65) Prior Publication Data

US 2009/0086553 A1    Apr. 2, 2009

(30) Foreign Application Priority Data

Sep. 27, 2007 (KR) .................. 10-2007-0097360

(51) Int. Cl.
*G11C 7/00* (2006.01)

(52) U.S. Cl. .................. 365/203; 365/189.04

(58) Field of Classification Search .................. 365/203, 365/189.04, 189.08, 189.11, 194
See application file for complete search history.

(56) References Cited

U.S. PATENT DOCUMENTS

| 6,320,806 | B1 | 11/2001 | Han |
| 6,697,992 | B2 * | 2/2004 | Ito et al. ......................... 714/763 |
| 7,023,746 | B2 | 4/2006 | Mizuhashi |
| 2006/0146619 | A1 * | 7/2006 | Kim et al. ..................... 365/194 |

FOREIGN PATENT DOCUMENTS

| JP | 2005-149662 | 6/2005 |
| KR | 10-0297717 B1 | 5/2001 |
| KR | 10-2001-0104901 A | 11/2001 |

* cited by examiner

*Primary Examiner* — Anh Phung
(74) *Attorney, Agent, or Firm* — Lee & Morse, P.C.

(57) ABSTRACT

A semiconductor memory device includes a memory cell array and an input/output path circuit. The input/output path circuit performs an input/output line pre-charge operation at a write end time point and outputs data stored in the memory cell array when the semiconductor memory device is operated in a read mode.

18 Claims, 13 Drawing Sheets

SEMICONDUCTOR MEMORY DEVICE AND METHOD OF INPUTTING AND OUTPUTTING DATA IN THE SEMICONDUCTOR MEMORY DEVICE

BACKGROUND

1. Technical Field

Example embodiments relate to a semiconductor memory device and to a method of inputting and outputting data in the semiconductor memory device.

2. Description of the Related Art

A typical semiconductor memory device, e.g., a dynamic random access memory (DRAM), includes a memory cell array having a plurality of memory cells. The memory cell array may be configured with a plurality of sub memory arrays and the memory cells may be randomly accessed to store data and output the stored data.

SUMMARY

Some example embodiments are directed providing a semiconductor memory device capable of securely performing a pre-charge operation and/or a data masking reset operation by performing the pre-charge operation and/or the data masking reset operation at a write end time point.

Some example embodiments provide an input/output control signal generating circuit capable of generating a column selection signal and a pre-charge control signal for a pre-charge operation and a data masking reset operation at a write end time point of a semiconductor memory device.

Some example embodiments provide a method of inputting and outputting data in a semiconductor memory device capable of securely performing a pre-charge operation and/or a data masking reset operation by performing the pre-charge operation and/or the data masking reset operation at a write end time point.

In some example embodiments, a semiconductor memory device includes a memory cell array and an input/output path circuit. The input/output path circuit may perform an input/output line pre-charge operation at a write end time point and outputs data stored in the memory cell array when the semiconductor memory device is operated in a read mode.

In some embodiments, the input/output path circuit may perform a data masking reset operation at the write end time point.

In some embodiments, the input/output path circuit may include a column selection circuit, a local pre-charge circuit, a multiplexer, and a global pre-charge circuit. The column selection circuit may electrically connect each of a plurality of bit line pairs to each of a plurality of local input/output line pairs in response to a column selection signal. The local pre-charge circuit may pre-charge the local input/output line pairs to a first voltage level in response to a local pre-charge control signal. The multiplexer may selectively connect the local input/output line pairs to global input/output line pair. The global pre-charge circuit may pre-charge the global input/output line pair to a second voltage level in response to a global pre-charge control signal.

In some embodiments, the input/output path circuit may further include an input driver and an output sense amplifier. The input driver may drive the global input/output line pair in response to a write data. The output sense amplifier may amplify data of the global input/output line pair to generate read data.

In some embodiments, the semiconductor memory device may further include a control signal generating circuit. The control signal generating circuit may generate a write end signal corresponding to the write end time point in response to a write column selection signal, and generate a pre-charge control signal based on the write end signal, a column selection enable signal and a column selection disable signal.

In some embodiments, the control signal generating circuit may include a write latency controller, a write range controller, a write end signal generating circuit, a data masking controller, a column controller, and a pre-charge control signal generating circuit. The write latency controller may generate the write column selection signal and a plurality of gating signals based on a write command signal, a write latency control signal and an internal clock signal. The write range controller may generate a write range signal based on the write command signal, the gating signals, and a burst length information signal. The write end signal generating circuit may generate a write end control signal and the write end signal based on the write command signal, the gating signals, and the burst length information signal. The data masking controller may generate an internal data masking signal based on an external data masking signal, the write column selection signal, and the write end control signal. The column controller may generate a column selection signal, the column selection enable signal, and the column selection disable signal based on the internal clock signal, address signals, a read column selection signal, the write column selection signal, and the internal data masking signal. The pre-charge control signal generating circuit may generate the pre-charge control signal based on the write range signal, the write end signal, the column selection enable signal, and the column selection disable signal.

In some embodiments, the burst length information signal may be enabled when a burst length corresponds to "eight", and the burst length information signal may be disabled when the burst length does not correspond to "eight".

In some embodiments, the write latency controller may include a write latency counter, a burst length counter, and a delay circuit. The write latency counter may delay the write command signal in response to the internal clock signal and the write latency control signal, and may generate a delayed write command signal and first through seventh gating signals. The burst length counter may further delay the delayed write command signal in response to the internal clock signal to generate an eighth gating signal, a ninth gating signal, and the write column selection signal. The delay circuit may delay the write column selection signal for a predetermined time to generate a tenth gating signal, an eleventh gating signal, and a twelfth gating signal.

In some embodiments, the write column selection signal may be equal to the ninth gating signal and the write column selection signal may be generated by further delaying the delayed write command signal according to a burst length.

In some embodiments, the write range controller may include a first OR gate, a second OR gate, a third OR gate, an AND gate, and a fourth OR gate. The first OR gate may perform an OR operation on the write command signal and the first through seventh gating signals. The second OR gate may perform an OR operation on the eighth through tenth gating signals. The third OR gate may perform an OR operation on the eleventh and twelfth gating signals. The AND gate may perform an AND operation on an output signal of the third OR gate and the burst length information signal. The fourth OR gate may perform an OR operation on an output signal of the first OR gate, an output signal of the second OR gate, and an output signal of the AND gate to generate the write range signal. The fourth OR gate may perform an OR operation on an output signal of the first OR gate, an output signal of the second OR gate, and an output signal of the AND gate to generate the write range signal.

In some embodiments, the write end signal generating circuit may include a logical operation circuit and an auto pulse generating circuit. The logical operation circuit may perform a logical operation on the write command signal, the first through eleventh gating signals, and the burst length information signal to generate the write end control signal. The auto pulse generating circuit may generate the write end signal in response to the write end control signal and the write end signal may be pulse form.

In some embodiments, the logical operation circuit may include a first OR gate, a second OR gate, a third OR gate, an AND gate, and a fourth OR gate. The first OR gate may perform an OR operation on the write command signal and the first through seventh gating signals. The second OR gate may perform an OR operation on the eighth and ninth gating signals. The third OR gate may perform an OR operation on the tenth and eleventh gating signals. The AND gate may perform an AND operation on an output signal of the third OR gate and the burst length information signal. The fourth OR gate may perform an OR operation on an output signal of the first OR gate, an output signal of the second OR gate, and an output signal of the AND gate to generate the write end control signal.

In some embodiments, the auto pulse generating circuit may include a delay circuit, an inverter, and a NOR gate. The delay circuit may delay the write end control signal. The inverter may invert an output signal of the delay circuit. The NOR gate may perform a NOR operation on the write end control signal and an output signal of the inverter to generate the write end signal.

In some embodiments, the write end signal may be generated when the write end control signal transitions from one state to another and the write end signal may have a pulse width corresponding to a delay time of the delay circuit.

In some embodiments, the data masking controller may include a flip-flop that performs a gating operation on the external data masking signal to output the internal data masking signal through an inversion output terminal, and the data masking controller may be reset in response to the write end control signal.

In some embodiments, the column controller may include an OR gate, a flip-flop, a latch circuit, an inverter, a first AND gate, and a second AND gate. The OR gate may perform an OR operation on the write column selection signal and the read column selection signal to generate the column selection enable signal. The flip-flop may perform a gating operation on the column selection enable signal in response to the internal clock signal to generate the column selection disable signal. The latch circuit may be enabled in response to the column selection enable signal and disabled in response to the column selection disable signal. The inverter may invert an output signal of the latch circuit. The first AND gate may perform an AND operation on column address signals. The second AND gate may perform an AND operation on an output signal of the inverter, an output signal of the first AND gate and the internal data masking signal to generate the column selection signal.

In some embodiments, the pre-charge control signal generating circuit may include a first OR gate, a multiplexer, a latch circuit, and a second OR gate. The first OR gate may perform an OR operation on the column selection disable signal and the write end signal. The multiplexer may selectively output one of a bank write signal and an output signal of the first OR gate in response to the write range signal. The latch circuit may be enabled in response to the column selection enable signal and disabled in response to an output signal of the multiplexer. The second OR gate may perform an OR operation on an output signal of the latch circuit and the write end signal to generate the local pre-charge control signal or the global pre-charge control signal.

In some example embodiments, an input/output control signal generating circuit included a write latency controller, a write range controller, a write end signal generating circuit, a data masking controller, a column controller, and a pre-charge control signal generating circuit. The write latency controller may generate a write column selection signal and a plurality of gating signals based on a write command signal, a write latency control signal, and an internal clock signal. The write range controller may generate a write range signal based on the write command signal, the gating signals, and a burst length information signal. The write end signal generating circuit may generate a write end control signal and a write end signal based on the write command signal, the gating signals, and the burst length information signal. The data masking controller may generate an internal data masking signal based on an external data masking signal, the write column selection signal, and the write end control signal. The column controller may generate a column selection signal, a column selection enable signal, and a column selection disable signal based on the internal clock signal, address signals, a read column selection signal, the write column selection signal, and the internal data masking signal. The pre-charge control signal generating circuit may generate a pre-charge control signal based on the write range signal, the write end signal, the column selection enable signal, and the column selection disable signal.

In a method of inputting and outputting data in a semiconductor memory device according to some example embodiments, an input/output line pre-charge operation is performed at a write end time point. Data stored in a memory cell array are output when the semiconductor memory device is operated in a read mode.

In some embodiments, additionally, a data masking reset operation may be performed at the write end time point.

In some embodiments, additionally, a write end signal is generated in response to a write column selection signal, the write end signal corresponding to the write end time point, and a pre-charge control signal is generated based on the write end signal, a column selection enable signal, and a column selection disable signal.

Therefore, the semiconductor memory device, the input/output control circuit, and the method of inputting and outputting memory in the semiconductor memory device may decrease a time between the write mode and the read mode (tWTR). Thus, the semiconductor memory device may be operated at high speed because the semiconductor memory device may accurately recognize the write end time point.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
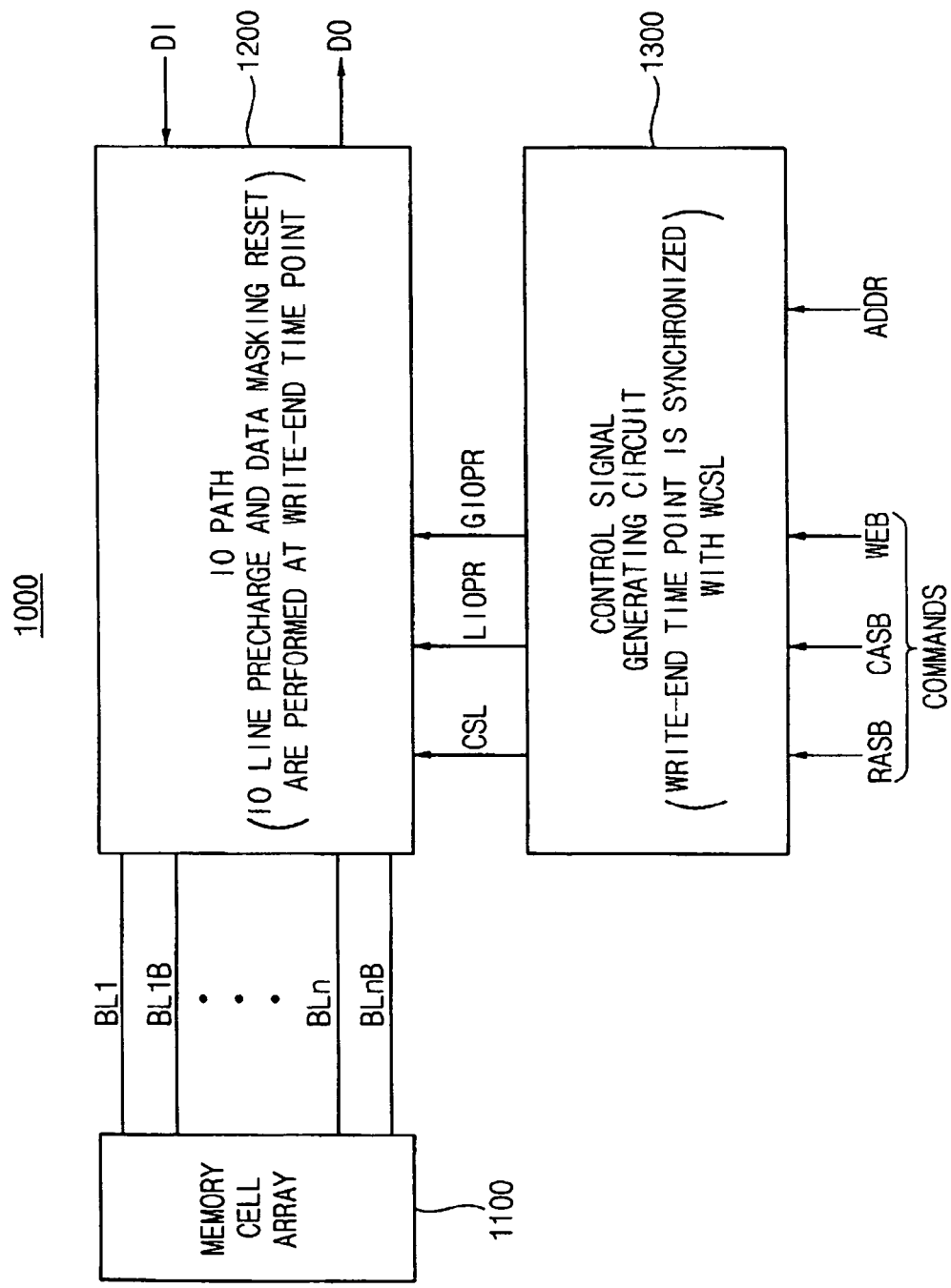
FIG. 1 illustrates a block diagram of a semiconductor memory device according to some example embodiments.

Korean Patent Application No. 2007-97360, filed on Sep. 27, 2007, in the Korean Intellectual Property Office, and entitled: "Semiconductor Memory Device and Method of Inputting and Outputting Data in the Semiconductor Memory Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of a semiconductor memory device according to some example embodiments.

Referring to FIG. 1, a semiconductor memory device 1000 may include a memory cell array 1100, an input/output path circuit 1200, and a control signal generating circuit 1300.

The memory cell array 1100 may include memory cells (not shown) in which data are stored. The input/output path circuit 1200 may perform an input/output line pre-charge operation and a data masking reset operation in response to a column selection signal CSL, a local pre-charge control signal LIOPR and a global pre-charge control signal GIOPR at a write end time point. The input/output path circuit 1200 may receive data stored in the memory cell array 1100 through a plurality of bit line pairs, BL1, BL1B, BLn and BLnB, and may generate an output data DO.

The control signal generating circuit 1300 may generate the column selection signal CSL, the local pre-charge control signal LIOPR, and the global pre-charge control signal GIOPR in response to command signals, e.g., a row address strobe signal RASB, a column address strobe signal CASB, and a write enable signal WEB etc., and an address signal ADDR. The control signal generating circuit 1300 may generate a write end signal corresponding to the write end time point and may generate the local pre-charge control signal LIOPR, the global pre-charge control signal GIOPR, and the column selection signal CSL in response to the write end signal, a column selection enable signal, and a column selection disable signal. The write end time point may be generated in synchronization with a write column selection signal WCSL.

Figure 2:
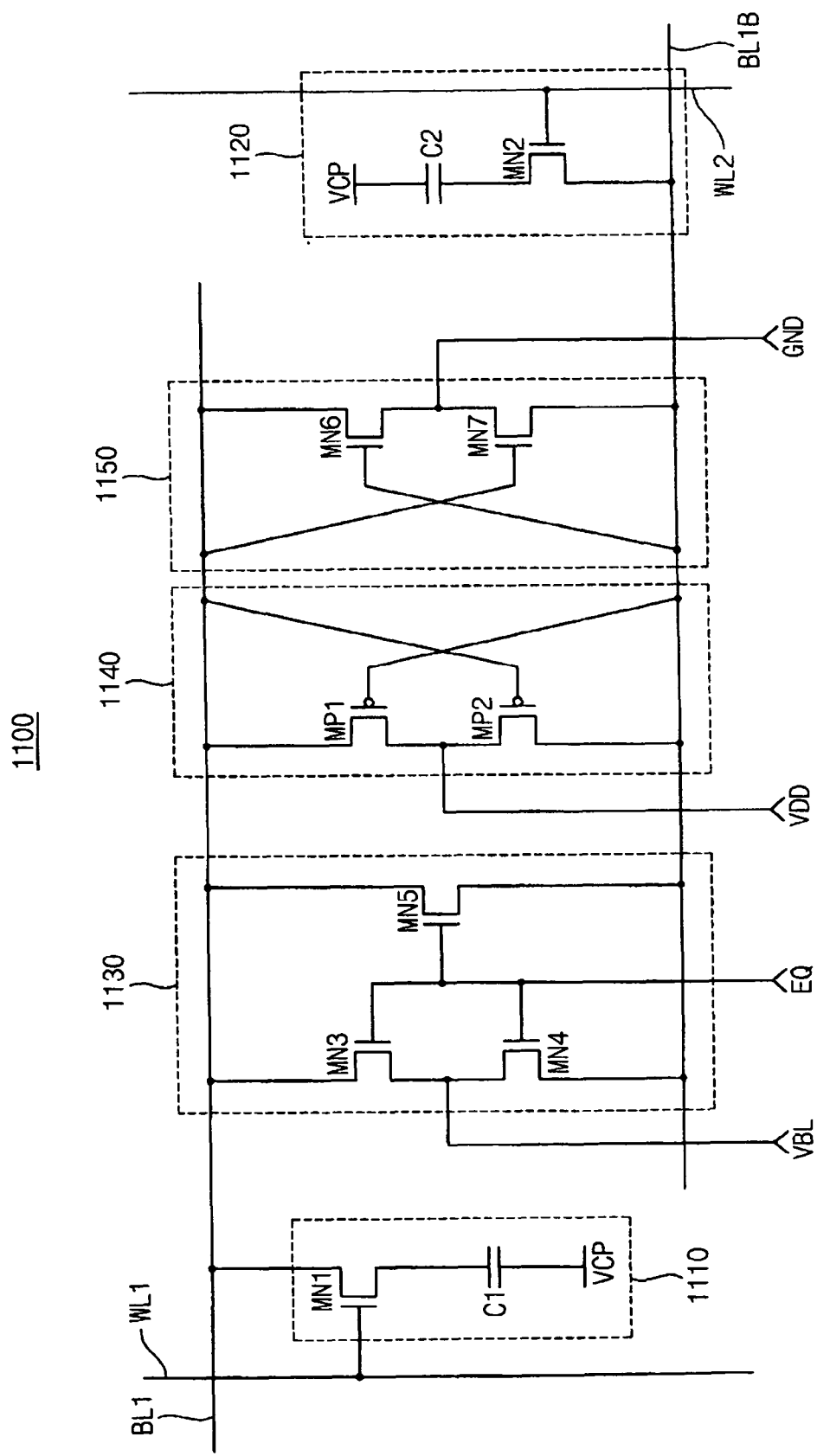
FIG. 2 illustrates a circuit diagram of a memory cell array in the semiconductor memory device of FIG. 1.

FIG. 2 illustrates a circuit diagram of the memory cell array 1100 in the semiconductor memory device of FIG. 1 in accordance with an embodiment. For convenience of description, a portion of the memory cell array 1100 is illustrated in FIG. 2. The memory cell array 1100 may have an open bit line, i.e., a bit line amplification circuit is between two sub memory arrays respectively arranged at a first side and a second side of the bit line amplification circuit.

Referring to FIG. 2, the memory cell array 1100 may include memory cells 1110 and 1120, a bit line pre-charge circuit 1130, a p-type sense amplifier 1140, and an n-type sense amplifier 1150.

The first bit line BL1 and the first bit line bar BL1B may be paired. Each of the sub memory arrays may be connected to the first bit line BL1 and the first bit line bar BL1B. The bit line pre-charge circuit 1130, the p-type sense amplifier 1140, and the n-type sense amplifier 1150 may be connected between the first bit line BL1 and the first bit line bar BL1B.

As illustrated in FIG. 2, the first memory cell 1110 may form a first sub memory array connected to the first bit line BL1, and the second memory cell 1120 may form a second sub memory array connected to the first bit line bar BL1B. The first memory cell 1110 may include a first n-channel metal oxide semiconductor (NMOS) transistor MN1 and a first capacitor C1. The first NMOS transistor MN1 may include a drain connected to the first bit line BL1 and a gate connected to a first word line WL1. A source of the first NMOS transistor MN1 may be connected to a first terminal of the first capacitor C1. A second terminal of the first capacitor C1 may receive a cell plate voltage VCP. The second memory cell 1120 may include a second NMOS transistor MN2 and a second capacitor C2. The second NMOS transistor MN2 may include a drain connected to the first bit line bar BL1B and a gate connected to a second word line WL2. A source of the second NMOS transistor MN2 may be connected to a first terminal of the second capacitor C2. A second terminal of the second capacitor C2 may receive the cell plate voltage VCP.

The bit line pre-charge circuit 1130 may include NMOS transistors MN3, MN4 and MN5 operated in response to an equalization control signal EQ. The bit line pre-charge circuit 1130 may pre-charge the first bit line BL1 and the first bit line bar BL1B to a bit line voltage VBL.

The p-type sense amplifier 1140 may include p-channel metal oxide semiconductor (PMOS) transistors MP1 and MP2 operated in response to voltage levels of the first bit line BL1 and the first bit line bar BL1B. The p-type sense amplifier 1140 may charge the first bit line BL1 or the first bit line bar BL1B to a power voltage VDD. The n-type sense amplifier 1150 may include NMOS transistors MN6 and MN7 operated in response to the voltage levels of the first bit line BL1 and the first bit line bar BL1B. The n-type sense amplifier 1150 may discharge the first bit line BL1 or the first bit line bar BL1B to a ground voltage VDD.

Figure 3:
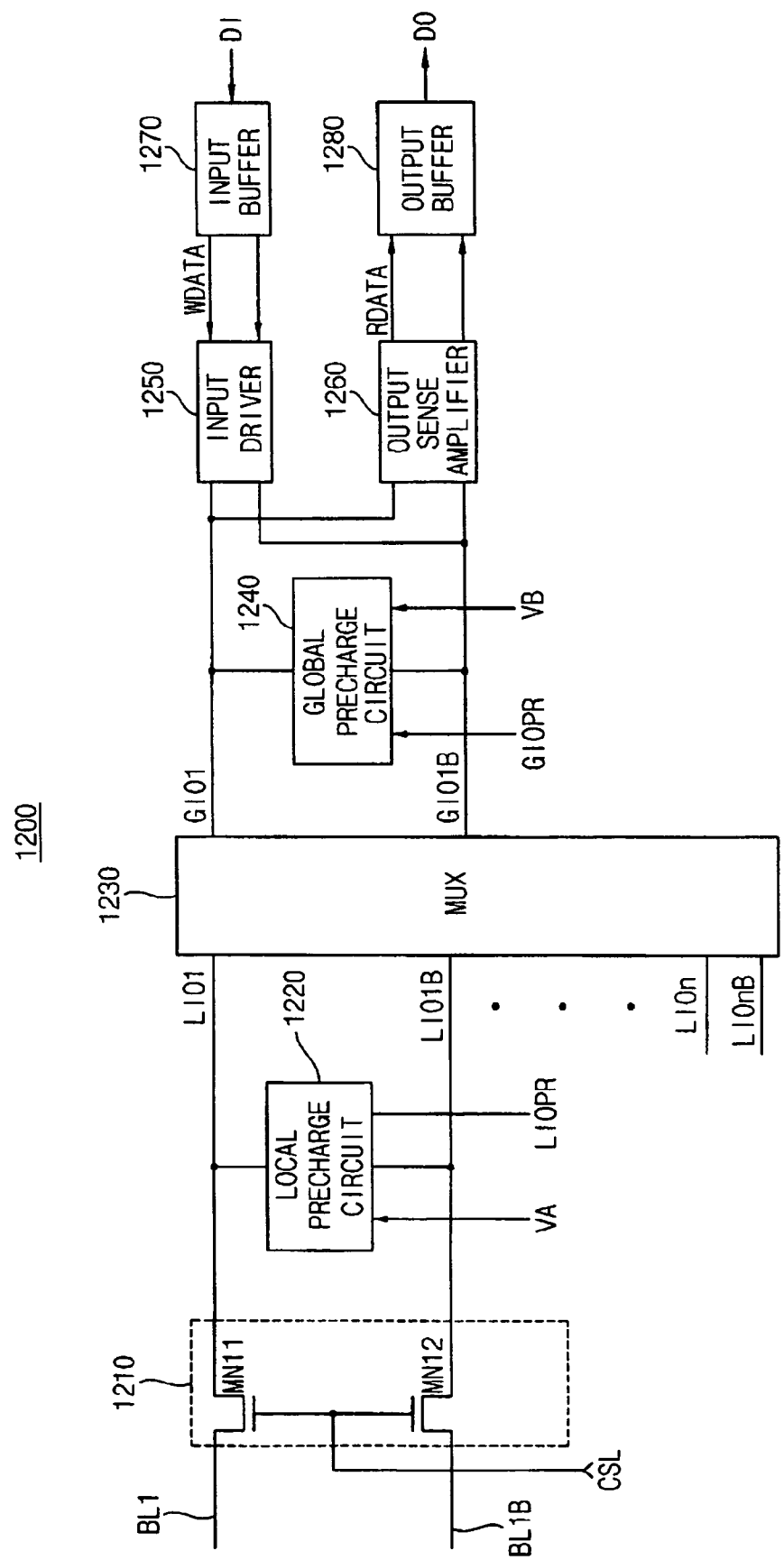
FIG. 3 illustrates a block diagram of an input/output path circuit in the semiconductor memory device of FIG. 1.

FIG. 3 illustrates a block diagram of the input/output path circuit 1200 in the semiconductor memory device of FIG. 1 according to an embodiment. Referring to FIG. 3, the input/output path circuit 1200 may include a column selection circuit 1210, a local pre-charge circuit 1220, a first multiplexer 1230, a global pre-charge circuit 1240, an input driver 1250, an output sense amplifier 1260, an input buffer 1270, and an output buffer 1280.

The column selection circuit 1210 may electrically connect the first bit line BL1 to a first local input/output line LIO1 in response to the column selection signal CSL and may electrically connect the first bit line bar BL1B to a first local input/output line bar LIO1B in response to the column selection signal CSL. The column selection circuit 1210 may include a third NMOS transistor MN11 and a fourth NMOS transistor MN12. The third NMOS transistor MN11 may electrically connect the first bit line BL1 to the first local input/output line LIO1 in response to the column selection signal CSL. The fourth NMOS transistor MN12 may electrically connect the first bit line bar BL1B to the first local input/output line bar LIO1B in response to the column selection signal CSL.

The local pre-charge circuit 1220 may pre-charge the first local input/output line LIO1 and the first local input/output line bar LIO1B to a first voltage level VA in response to the local pre-charge control signal LIOPR. The first multiplexer 1230 may selectively connect one of local input/output line pairs LIO1/LIO1B through LIOn/LIOnB to a global input/output line pair GIO1/GIO1B. The global pre-charge circuit 1240 may pre-charge the global input/output line GIO1 and the global input/output line bar GIO1B to a second voltage level VB in response to the global pre-charge control signal GIOPR.

The input buffer 1270 may buffer an input data DI to generate a write data WDATA. The input driver 1250 may drive the pair of global input/output lines GIO1 and GIO1B in response to the write data WDATA. The output sense amplifier 1260 may amplify data on the pair of global input/output lines GIO1 and GIO1B to generate read data RDATA. The output buffer 1280 may buffer the read data RDATA to generate the output data DO.

Hereinafter, an operation of the input/output path circuit 1200 in FIG. 3 is described in accordance with an implementation.

When data is written into the semiconductor memory device 1000, the input data DI may be applied to the input buffer 1270. After the pair of local input/output lines LIO1 and LIO1B is pre-charged by the local pre-charge circuit 1220 and the pair global input/output lines GIO1 and GIO1B is pre-charged by the global pre-charge circuit 1240, data buffered by the input buffer 1270 may be applied to the pair of global input/output lines GIO1 and GIO1B by the input driver 1250. The data on the pair of global input/output lines GIO1 and GIO1B may be transferred to one of the local input/output line pairs LIO1/LIO1B and LIOn/LIOnB selected by the first multiplexer 1230. As an example, FIG. 3 illustrates that a pair of local input/output lines selected by the first multiplexer 1230 is the first pair of local input/output lines LIO1 and LIO1B. At this time, one memory cell in the memory cell array 10 is selected by a word line driving signal WL and the column selection signal CSL, and the data of the first pair of local input/output lines LIO1 and LIO1B are written into the selected memory cell.

When the data written into the semiconductor memory device 1000 is read, each data of memory cells connected to an activated word line may be transferred to corresponding to a pair of bit lines and amplified by the bit line sense amplifier. One pair of bit lines of the plurality of bit line pairs BL1, BL1B, BLn and BLnB may be selected by the column selection signal CSL. As an example, FIG. 3 illustrates that a pair of bit lines selected by the column selection signal CSL is the first pair of bit lines BL1 and BL1B. Data on the first pair of bit lines BL1 and BL1B selected by the column selection signal CSL may be transferred to the first pair of local input/output lines LIO1/LIO1B pre-charged by the local pre-charge circuit 1220. Data on the first pair of local input/output lines LIO1/LIO1B may be transferred to the pair of global input/output lines GIO1 and GIO1B pre-charged by the global pre-charge circuit 1220. The data on the first pair of local input/output lines LIO1/LIO1B may be transferred to the pair of global input/output lines GIO1 and GIO1B through the first multiplexer 1230. Data on the pair of global input/output lines GIO1 and GIO1B may be amplified by the output sense amplifier 1260, buffered by the output buffer 1280, and output.

As described above, when data is written into a semiconductor memory device 1000 or data is read from the semiconductor memory device 1000, the written or read data may be transferred through pairs of pre-charged input/output lines GIO, GIOB, LIO and LIOB after the pair of global input/output lines GIO1 and GIO1B and the pair of local input/output lines LIO1 and LIO1B are pre-charged.

The input/output path circuit 1200 in the semiconductor memory device 1000 may perform an input/output line pre-charge operation and a data masking reset operation in response to the column selection signal CSL, the local pre-charge control signal LIOPR, and the global pre-charge control signal GIOPR at the write end time point. Furthermore, the input/output path circuit 1200 may receive data stored in the memory cell array 1100 through a plurality of bit line pairs BL1, BL1B, BLn, and BLnB, and may generate output data DO.

Figure 4:
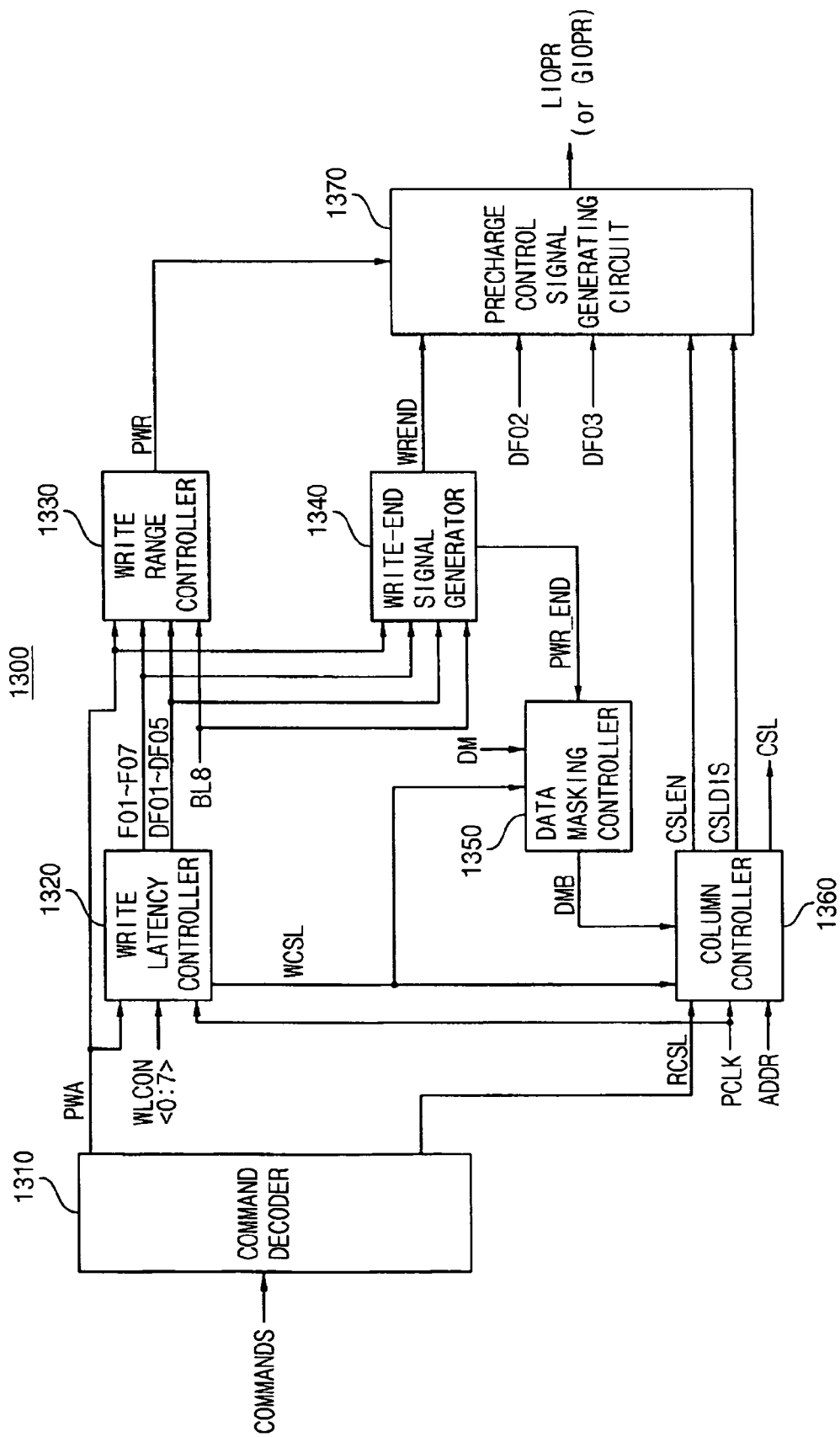
FIG. 4 illustrates a block diagram of a control signal generating circuit in the semiconductor memory device of FIG. 1.

FIG. 4 illustrates a block diagram of the control signal generating circuit 1300 in the semiconductor memory device of FIG. 1 in accordance with an embodiment. Referring to FIG. 4, the control signal generating circuit 1300 may include a command decoder 1310, a write latency controller 1320, a write range controller 1330, a write end signal generating circuit 1340, a data masking controller 1350, a column controller 1360, and a pre-charge control signal generating circuit 1370. As an example, a configuration of the control signal generating circuit 1300 is illustrated in FIG. 4 where a maximum write latency of the semiconductor memory device 1000 is "7". The maximum write latency of the semiconductor memory device 1000 may be an arbitrary number.

The command decoder 1310 may decode the command signals, e.g., RASB, CASB, and WEB, etc., to generate a write command signal PWA and a read column selection signal RCSL. The write latency controller 1320 may generate a write column selection signal WCSL, first through seventh gating signals F01, F02, F03, F04, F05, F06, and F07, and eighth through twelfth gating signals DF01, DF02, DF03, DF04, and DF05 based on the write command signal PWA, a write latency control signal WLCON<0:7>, and an internal clock signal PCLK. The write range controller 1330 may generate a write range signal PWR based on the write command signal PWA, the first through seventh gating signals F01, F02, F03, F04, F05, F06, and F07, the eighth through twelfth gating signals DF01, DF02, DF03, DF04, and DF05, and a burst length information signal BL8.

The write end signal generating circuit 1340 may generate a write end control signal PWR_END and a write end signal WREND based on the write command signal PWA, the first through seventh gating signals F01, F02, F03, F04, F05, F06, and F07, the eighth through eleventh gating signals DF01, DF02, DF03, and DF04, and the burst length information signal BL8. The data masking controller 1350 may generate a second data masking signal DMB based on a first data masking signal DM, the write column selection signal WCSL and the write end control signal PWR_END. For example, the burst length information signal BL8 may be logic "1" when a burst length is eight, and the burst length information signal BL8 may be logic "0" when the burst length is not eight.

The column controller 1360 may generate the column selection signal CSL, the column selection enable signal CSLEN, and the column selection disable signal CSLDIS based on the internal clock signal PCLK, the address signal ADDR, the read column selection signal RCSL, the write column selection signal WCSL, and the second data masking signal DMB.

The pre-charge control signal generating circuit 1370 may generate the local pre-charge control signal LIOPR based on the write range signal PWR, the write end signal WREND, the ninth gating signal DF2, the tenth gating signal DF03, the column selection enable signal CSLEN, and the column selection disable signal CSLDIS. The control signal generating circuit 1370 having a configuration illustrated in FIG. 4 may be used to generate the global pre-charge control signal GIOPR.

Hereinafter, an operation of the control signal generating circuit 1300 in FIG. 4 is described in accordance with an implementation.

The control signal generating circuit 1300 may generate the write range signal PWR, the write end control signal PWR_END, and the write end signal WREND based on the write command signal PWA, the first through seventh gating signals F01, F02, F03, F04, F05, F06, and F07, the eighth through twelfth gating signals DF01, DF02, DF03, DF04, and DF05, and the burst length information signal BL8. The control signal generating circuit 1300 may generate the second data masking signal DMB based on the first data masking signal DM, the write column selection signal WCSL, and the write end control signal PWR_END. The control signal generating circuit 1300 may generate the column selection signal CSL, the column selection enable signal CSLEN, and the column selection disable signal CSLDIS based on the internal clock signal PCLK, the address signal ADDR, the read column selection signal RCSL, the write column selection signal WCSL, and the second data masking signal DMB.

Furthermore, the control signal generating circuit 1300 may generate the local pre-charge control signal LIOPR or the global pre-charge control signal GIOPR based on the write range signal PWR, the write end signal WREND, the ninth gating signal DF02, the tenth gating signal DF03, the column selection enable signal CSLEN, and the column selection disable signal CSLDIS. Therefore, the local pre-charge control signal LIOPR or the global pre-charge control signal GIOPR may be generated based on the write end signal corresponding to the write end time point.

Figure 5:
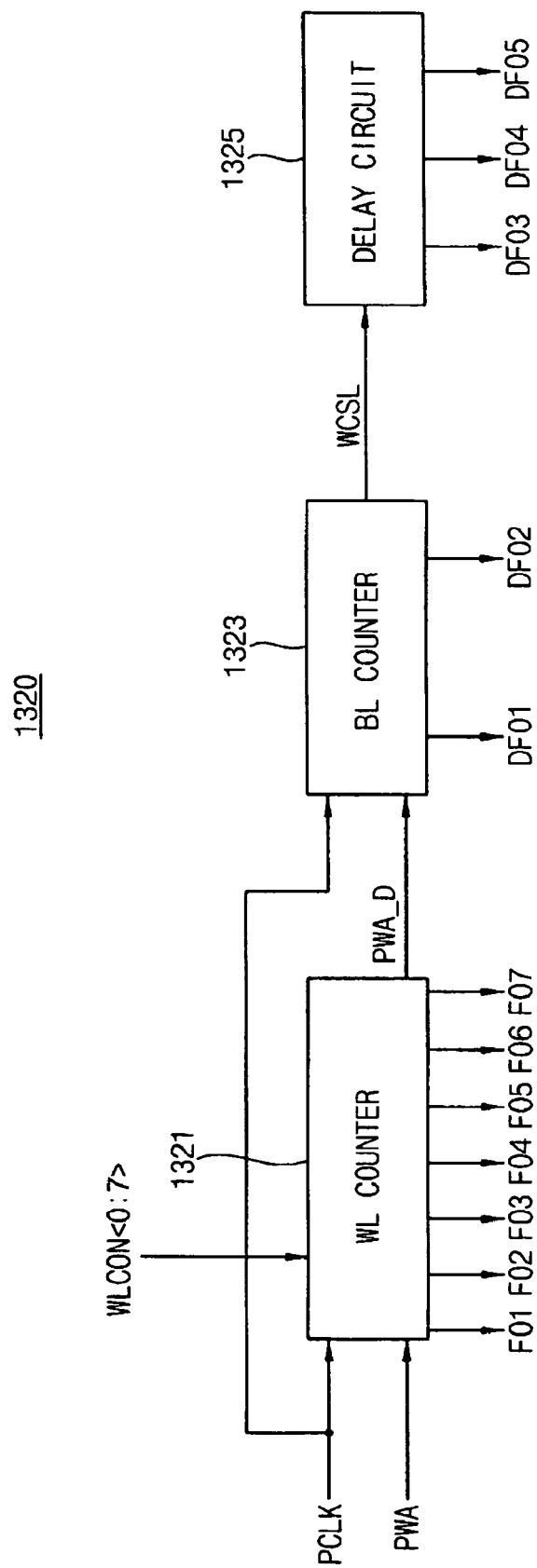
FIG. 5 illustrates a block diagram of a write latency controller in the control signal generating circuit of FIG. 4.

FIG. 5 illustrates a block diagram of a write latency controller 1320 in the control signal generating circuit 1300 of FIG. 4 in accordance with an embodiment. Referring to FIG. 5, the write latency controller 1320 may include a write latency (WL) counter 1321, a burst length (BL) counter 1323, and a delay circuit 1325.

The WL counter 1321 may delay the write command signal PWA for a first predetermined time in response to the internal clock signal PCLK and the write latency control signal WLCON<0:7>, and may generate a delayed write command signal PWA_D and the first through seventh gating signals F01, F02, F03, F04, F05, F06, and F07. The BL counter 1323 may delay the delayed write command signal PWA_D to generate the eighth gating signal DF01, the ninth gating signal DF02, and the write column selection signal WCSL.

The write column selection signal WCSL may be equal to the ninth gating signal DF02. The write column selection signal WCSL may be a signal generated by further delaying the delayed write command signal PWA_D according to the burst length of the semiconductor memory device 1000 in FIG. 1.

The delay circuit 1325 may delay the write column selection signal WCSL to generate the tenth gating signal DF03, the eleventh gating signal DF04 and the twelfth gating signal DF05.

Figure 6:
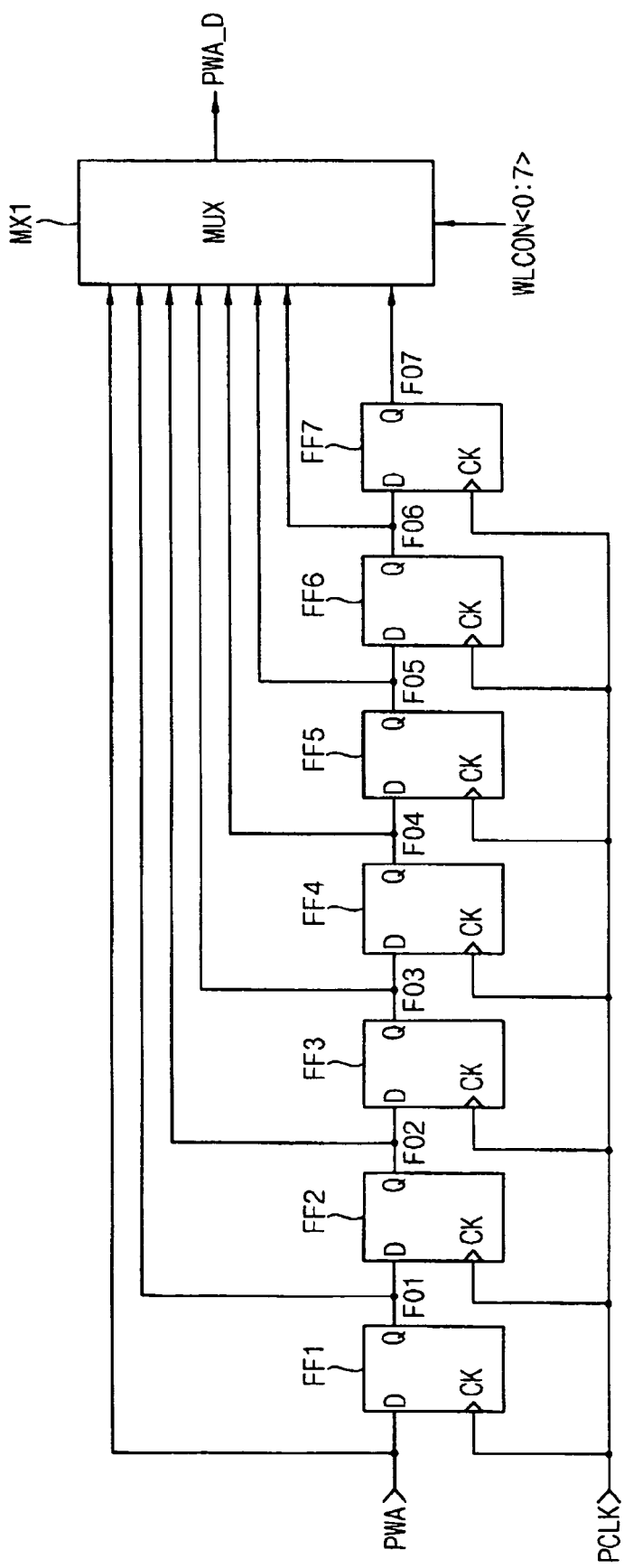
FIG. 6 illustrates a circuit diagram of a write latency counter in the write latency controller of FIG. 5.

FIG. 6 illustrates a circuit diagram of the WL counter 1321 in the write latency controller 1320 of FIG. 5, in accordance with an embodiment. Referring to FIG. 6, the WL counter 1321 may include a first through a seventh flip-flops FF1, FF2, FF3, FF4, FF5, FF6, and FF7, and a second multiplexer MX1.

The first flip-flop FF1 may perform a gating operation on the write command signal PWA in response to the internal clock signal PCLK to generate the first gating signal F01. The second flip-flop FF2 may perform a gating operation on the first gating signal F01 in response to the internal clock signal PCLK to generate the second gating signal F02. The third flip-flop FF3 may perform a gating operation on the second gating signal F02 in response to the internal clock signal PCLK to generate the third gating signal F03. The fourth flip-flop FF4 may perform a gating operation on the third gating signal F03 in response to the internal clock signal PCLK to generate the fourth gating signal F04. The fifth flip-flop FF5 may perform a gating operation on the fourth gating signal F04 in response to the internal clock signal PCLK to generate the fifth gating signal F05. The sixth flip-flop FF6 may perform a gating operation on the fifth gating signal F05 in response to the internal clock signal PCLK to generate the sixth gating signal F06. The seventh flip-flop FF7 may perform a gating operation on the sixth gating signal F06 in response to the internal clock signal PCLK to generate the seventh gating signal F07.

The second multiplexer MX1 may select one of the write command signal PWA and the first through seventh gating signals F01, F02, F03, F04, F05, F06, and F07 to output the delayed write command signal PWA_D.

Hereinafter, an operation of the WL counter 1321 in FIG. 6 is described according to an implementation.

The maximum write latency of the WL counter 1321 in FIG. 6 is seven, and the WL counter 1321 may include seven flip-flops FF1, FF2, FF3, FF4, FF5, FF6, and FF7. As mention above, the write latency counter 1321 may include arbitrary number of flip-flops according to the maximum write latency of the semiconductor memory device 1000.

As illustrated in FIG. 6, the first gating signal F01 may be generated by delaying the write command signal PWA for one clock cycle, the second gating signal F02 may be generated by delaying the write command signal PWA for two clock cycles, the third gating signal F03 may be generated by delaying the write command signal PWA for three clock cycles, the fourth gating signal F04 may be generated by delaying the write command signal PWA for four clock cycles, the fifth gating signal F05 may be generated by delaying the write command signal PWA for five clock cycles, the sixth gating signal F06 may be generated by delaying the write command signal PWA for six clock cycles, and the seventh gating signal F07 may be generated by delaying the write command signal PWA for seven clock cycles.

The write latency control signal WLCON<0:7> includes eight bits. The second multiplexer MX1 may select one of the write command signals PWA and the first through seventh gating signals F01, F02, F03, F04, F05, F06, and F07, and may output the selected signal as the delayed write command signal PWA_D. For example, the write command signal PWA may be output as the delayed write command signal PWA_D when a first write latency control signal WLCON<0> is enabled, the first gating signal F01 may be output as the delayed write command signal PWA_D when a second write latency control signal WCON<1> is enabled, the second gating signal F02 may be output as the delayed write command signal PWA_D when a third write latency control signal WCON<2> is enabled, the third gating signal F03 may be output as the delayed write command signal PWA_D when a fourth write latency control signal WCON<3> is enabled, the fourth gating signal F04 may be output as the delayed write command signal PWA_D when a fifth write latency control signal WCON<4> is enabled, the fifth gating signal F05 may be output as the delayed write command signal PWA_D when a sixth write latency control signal WCON<5> is enabled, the sixth gating signal F06 may be output as the delayed write command signal PWA_D when a seventh write latency control signal WCON<6> is enabled, and the seventh gating signal F07 may be output as the delayed write command signal PWA_D when an eighth write latency control signal WCON<7> is enabled.

The write latency may be "1" when the first gating signal F01 is output as the delayed write command signal PWA_D and the write latency may be "7" when the seventh gating signal F07 is output as the delayed write command signal PWA_D. As such, the write latency may be a natural number "n" when the nth gating signal is output as the delayed write command signal PWA_D.

Figure 7:
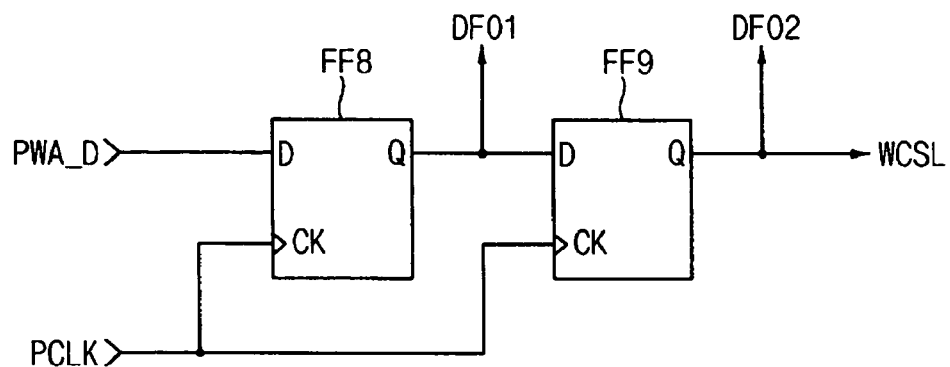
FIG. 7 illustrates a circuit diagram of a burst length counter in the write latency controller of FIG. 5.

FIG. 7 illustrates a circuit diagram of the BL counter 1323 in the write latency controller of FIG. 5. Referring to FIG. 7, the BL counter 1323 may include an eighth flip-flop FF8 and a ninth flip-flop FF9.

The eighth flip-flop FF8 may perform a gating operation on the delayed write command signal PWA_D in response to the internal clock signal PCLK to generate the eighth gating signal DF01. The ninth flip-flop FF9 may perform a gating operation on the eighth gating signal DF01 in response to the internal clock signal PCLK to generate the ninth gating signal DF02. The ninth gating signal DF02 may be substantially equal to the write column selection signal WCSL illustrated in FIG. 4.

As an example, FIG. 7 illustrates the BL counter 1323 where the burst length is "4". That is, the BL counter 1323 is an example of a burst length counter included in a semiconductor memory device having a four-bit pre-fetch operation mode.

The eighth gating signal DF01 may be generated by further delaying the delayed write command signal PWA_D for one clock cycle. The ninth gating signal DF02 may be generated by delaying the delayed write command signal PWA_D for two clock cycles. The write column selection signal WCSL may be substantially equal to the ninth gating signal DF02, such that the write column selection signal WCSL may be generated by further delaying the delayed write command signal PWA_D for two clock cycles.

The BL counter 1323 may include four flip-flops when the burst length is "8". That is, the BL counter 1323 may include four flip-flops when the BL counter 1323 is included in a semiconductor memory device having an eight-bit pre-fetch operation mode.

Figure 8:
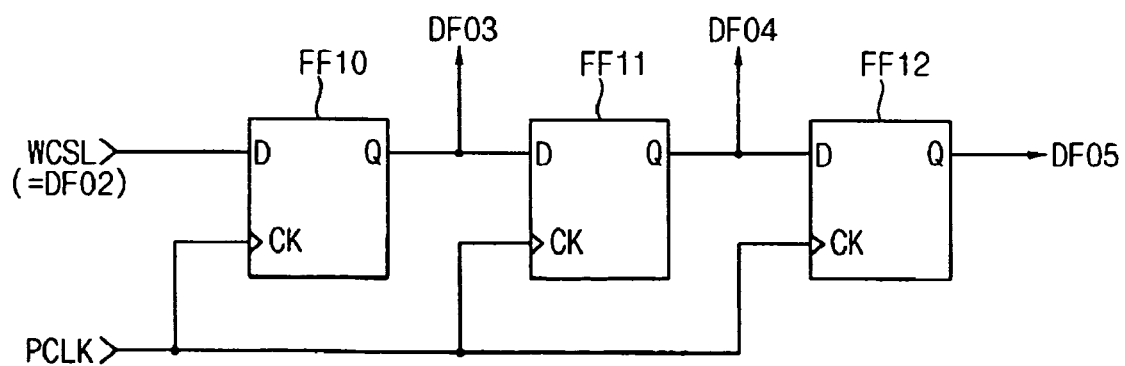
FIG. 8 illustrates a circuit diagram of a delay circuit in the write latency controller of FIG. 5.

FIG. 8 illustrates a circuit diagram of the delay circuit 1325 in the write latency controller 1320 of FIG. 5 according to an embodiment. Referring to FIG. 8, the delay circuit 1325 may include a tenth flip-flop FF10, an eleventh flip-flop FF11, and a twelfth flip-flop FF12.

The tenth flip-flop FF10 may perform a gating operation on the write column selection signal WCSL in response to the internal clock signal PCLK to generate the tenth gating signal DF03. The eleventh flip-flop FF11 may perform a gating operation on the tenth gating signal DF03 in response to the internal clock signal PCLK to generate the eleventh gating signal DF04. The twelfth flip-flop FF12 may perform a gating operation on the eleventh gating signal DF04 in response to the internal clock signal PCLK to generate the twelfth gating signal DF05. The tenth gating signal DF03 may be generated by delaying the write column selection signal WCSL for one clock cycle, the eleventh gating signal DF04 may be generated by delaying the write column selection signal WCSL for two clock cycles, and the twelfth gating signal DF05 may be generated by delaying the write column selection signal WCSL for three clock cycles.

Figure 9:
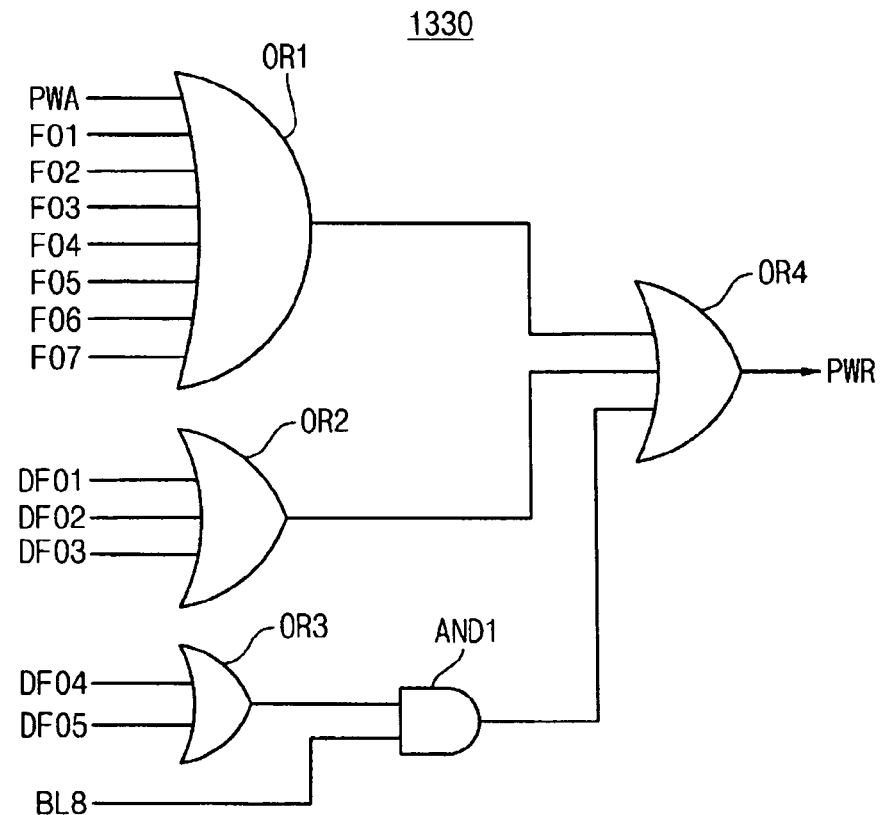
FIG. 9 illustrates a circuit diagram of a write range controller in the control signal generating circuit of FIG. 4.

FIG. 9 illustrates a circuit diagram of the write range controller 1330 in the control signal generating circuit 1300 of FIG. 4 according to an embodiment. Referring to FIG. 9, the write range controller 1330 may include a first OR gate OR1, a second OR gate OR2, a third OR gate OR3, a first AND gate AND1, and a fourth OR gate OR4.

The first OR gate OR1 may perform an OR operation on the write command signal PWA and the first through seventh gating signals F01, F02, F03, F04, F05, F06, and F07. The second OR gate OR2 may perform an OR operation on the eighth through tenth gating signals DF01, DF02, and DF03. The third OR gate OR3 may perform an OR operation on the eleventh and twelfth gating signals DF04 and DF05. The first AND gate AND1 may perform an AND operation on an output signal of the third OR gate OR3 and the burst length information signal BL8. The fourth OR gate OR4 may perform an OR operation on an output signal of the first OR gate OR1, an output signal of the second OR gate OR2, and an output signal of the first AND gate AND1 to generate the write range signal PWR.

Hereinafter, an operation of the write range controller 1330 in FIG. 9 is described in accordance with an implementation.

When the burst length is "4", the write range controller 1330 may perform an OR operation on the write command signal PWA, the first through seventh gating signals F01, F02, F03, F04, F05, F06, and F07, and the eighth through tenth gating signals DF01, DF02, and DF03, and may generate the write range signal PWR.

When the burst length is "8", the write range controller 1330 may perform an OR operation on the write command signal PWA, the first through seventh gating signals F01, F02, F03, F04, F05, F06, and F07 and the eighth through twelfth gating signals DF01, DF02, DF03, DF04, and DF05, and may generate the write range signal PWR.

The burst length information signal BL8 may be logic "1" when the burst length is "8", and the burst length information signal BL8 may be logic "0" when the burst length is not "8". Therefore, the fourth OR gate OR4 may perform an OR operation including the eleventh and twelfth gating signals DF04 and DF05 to generate the write range signal PWR.

Figure 10:
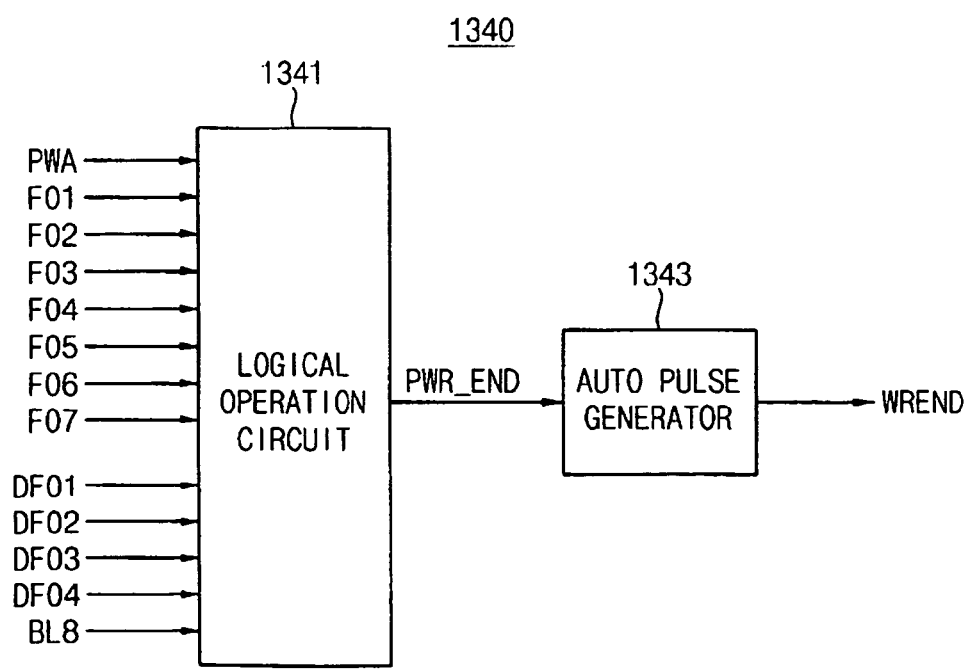
FIG. 10 illustrates a block diagram of a write end signal generating circuit in the control signal generating circuit of FIG. 4.

FIG. 10 illustrates a block diagram of the write end signal generating circuit 1340 in the control signal generating circuit 1300 of FIG. 4 according to an embodiment. Referring to FIG. 10, the write end signal generating circuit 1340 may include a logical operation circuit 1341 and an auto pulse generating circuit 1343.

The logical operation circuit 1341 may perform a logical operation on the write command signal PWA, the first through eleventh gating signals F01, F02, F03, F04, F05, F06, F07, DF01, DF02, DF03, and DF04, and burst length information signal BL8, and may generate the write end control signal PWR_END. The auto pulse generating circuit 1343 may generate the write end signal WREND based on the write end control signal PWR_END. The write end signal WREND may be a pulsed signal.

Figure 11:
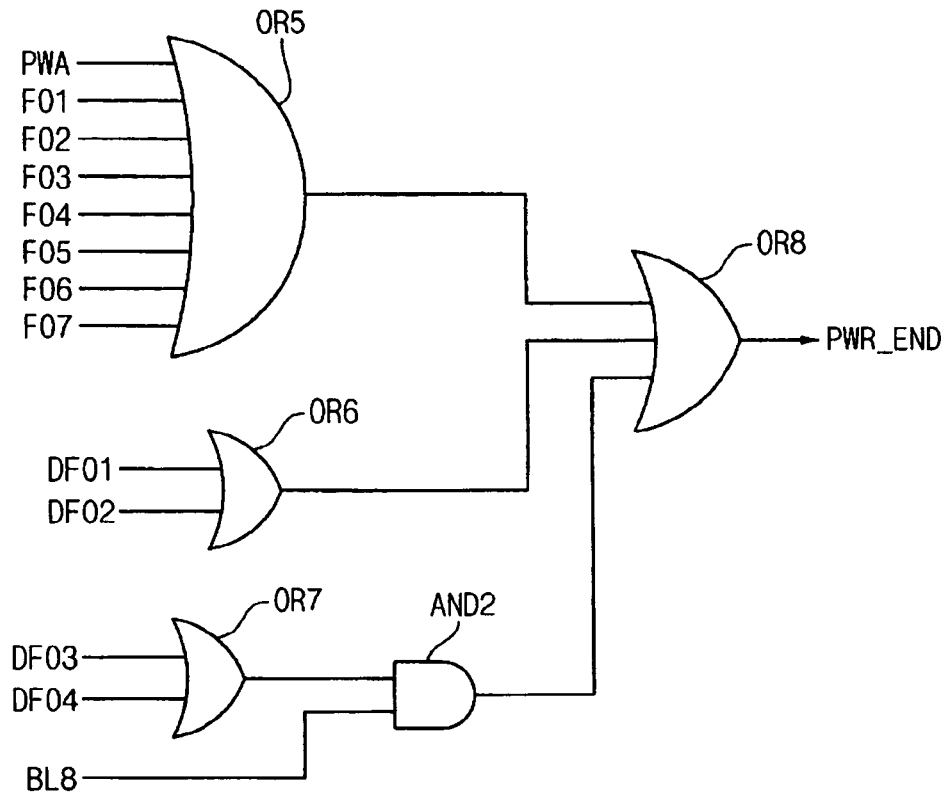
FIG. 11 illustrates a circuit diagram of a logical operation circuit in the write end signal generating circuit of FIG. 10.

FIG. 11 illustrates a circuit diagram of the logical operation circuit 1341 in the write end signal generating circuit 1340 of FIG. 10 in accordance with an embodiment. Referring to FIG. 11, the logical operation circuit 1341 may include a fifth OR gate OR5, a sixth OR gate OR6, a seventh OR gate OR7, a second AND gate AND2, and an eighth OR gate OR8.

The fifth OR gate OR5 may perform an OR operation on the write command signal PWA and the first through seventh gating signals F01, F02, F03, F04, F05, F06, and F07. The sixth OR gate OR6 may perform an OR operation on the eighth and ninth gating signals DF01 and DF02. The seventh OR gate OR7 may perform an OR operation on the tenth and eleventh gating signals DF03 and DF04. The second AND gate AND2 may perform an AND operation on an output signal of the seventh OR gate OR7 and the burst length information signal BL8. The eighth OR gate OR8 may perform an OR operation on an output signal of the fifth OR gate OR5, an output signal of the sixth OR gate OR6, and an output signal of the second AND gate AND2 to generate the write end control signal PWR_END.

Hereinafter, an operation of the logical operation circuit 1341 in FIG. 11 is described in accordance with an implementation.

When the burst length is "4", the logical operation circuit 1341 may perform an OR operation on the write command signal PWA, the first through seventh gating signals F01, F02, F03, F04, F05, F06 and F07 and the eighth and ninth gating signals DF01 and DF02, and generates the write end control signal PWR_END.

When the burst length is "8", the logical operation circuit 1341 may perform an OR operation on the write command signal PWA, the first through seventh gating signals F01, F02, F03, F04, F05, F06, and F07, and the eighth through eleventh gating signals DF01, DF02, DF03 and DF04, and may generate the write end control signal PWR_END.

The burst length information signal BL8 may be logic "1" when the burst length is "8", and the burst length information signal BL8 may be logic "0" when the burst length is not "8". Therefore, the eighth OR gate OR8 may perform an OR operation including the tenth and eleventh gating signals DF03 and DF04 to generate the write end control signal PWR_END.

Figure 12:
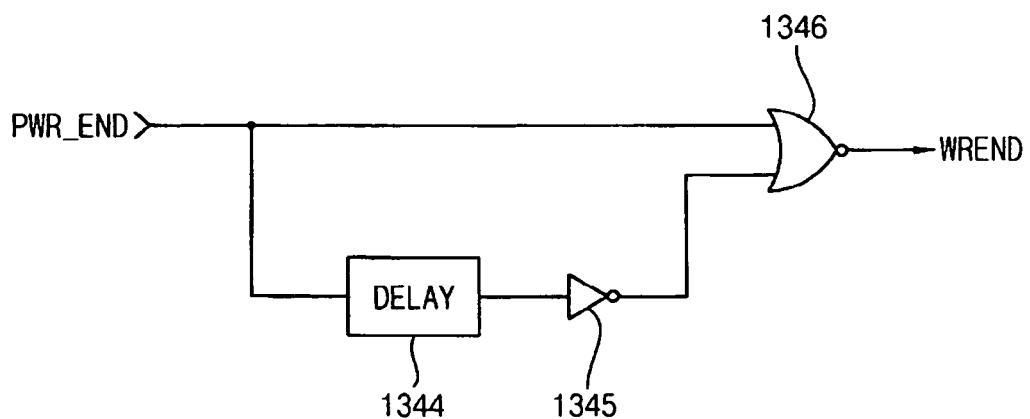
FIG. 12 illustrates a block diagram of an auto pulse generating circuit in the write end signal generating circuit of FIG. 10.

FIG. 12 illustrates a block diagram of the auto pulse generating circuit 1343 in the write end signal generating circuit 1340 of FIG. 10 according to an embodiment. Referring to FIG. 12, the auto pulse generating circuit 1343 may include a delay circuit 1344, a first inverter 1345, and a first NOR gate 1346.

The delay circuit 1344 may delay the write end control signal PWR_END, and the inverter 1345 may invert an output signal of the delay circuit 1344. The first NOR gate 1346 may perform a NOR operation on the write end control signal PWR_END and an output signal of the first inverter 1345 to output the write end signal WREND having pulse form.

The write end signal WREND may be generated when the write end control signal PWR_END transitions to logic "low" level, and the write end signal WREND may have a pulse width corresponding to a delay time of the delay circuit 1344.

Figure 13:
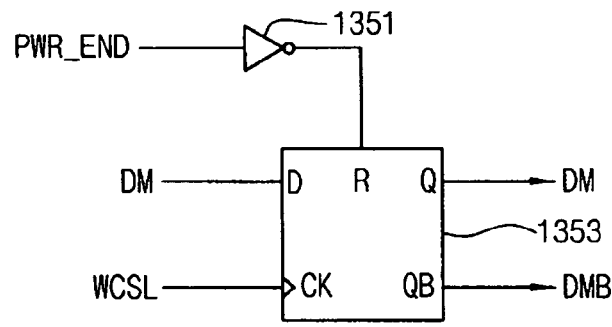
FIG. 13 illustrates a circuit diagram of a data masking controller in the control signal generating circuit of FIG. 4.

FIG. 13 illustrates a circuit diagram of the data masking controller 1350 in the control signal generating circuit 1300 of FIG. 4 in accordance with an embodiment. Referring to FIG. 13, the data masking controller 1350 may include a second inverter 1351 and a thirteenth flip-flop 1353.

The second inverter 1351 may invert the write end control signal PWR_END. The thirteenth flip-flop 1353 may be reset in response to an output signal of the second inverter 1351. The thirteenth flip-flop 1353 may perform a gating operation on the first data masking signal DM and may output the second data masking signal DMB through an inversion output terminal QB of the thirteenth flip-flop 1353.

Hereinafter, an operation of the data masking controller 1350 in FIG. 13 is described in accordance with an implementation.

The thirteenth flip-flop 1353 may be operated in response to the write column selection signal WCSL. When the write end control signal PWR_END is logic "high" state and the second inverter 1351 is logic "low" state, the thirteenth flip-flop 1353 is not reset. Thus, the first data masking signal DM is output through an output terminal Q of the thirteenth flip-flop 1353 in response to the write column selection signal WCSL. When the write end control signal PWR_END is logic "low" state and the output signal of the second inverter 1351 is logic "high" state, the thirteenth flip-flop 1353 is reset. Thus, the output terminal Q is disabled and the inversion output terminal QB is enabled. At this time, the second data masking signal DMB output through the inversion output terminal QB is enabled.

Figure 14:
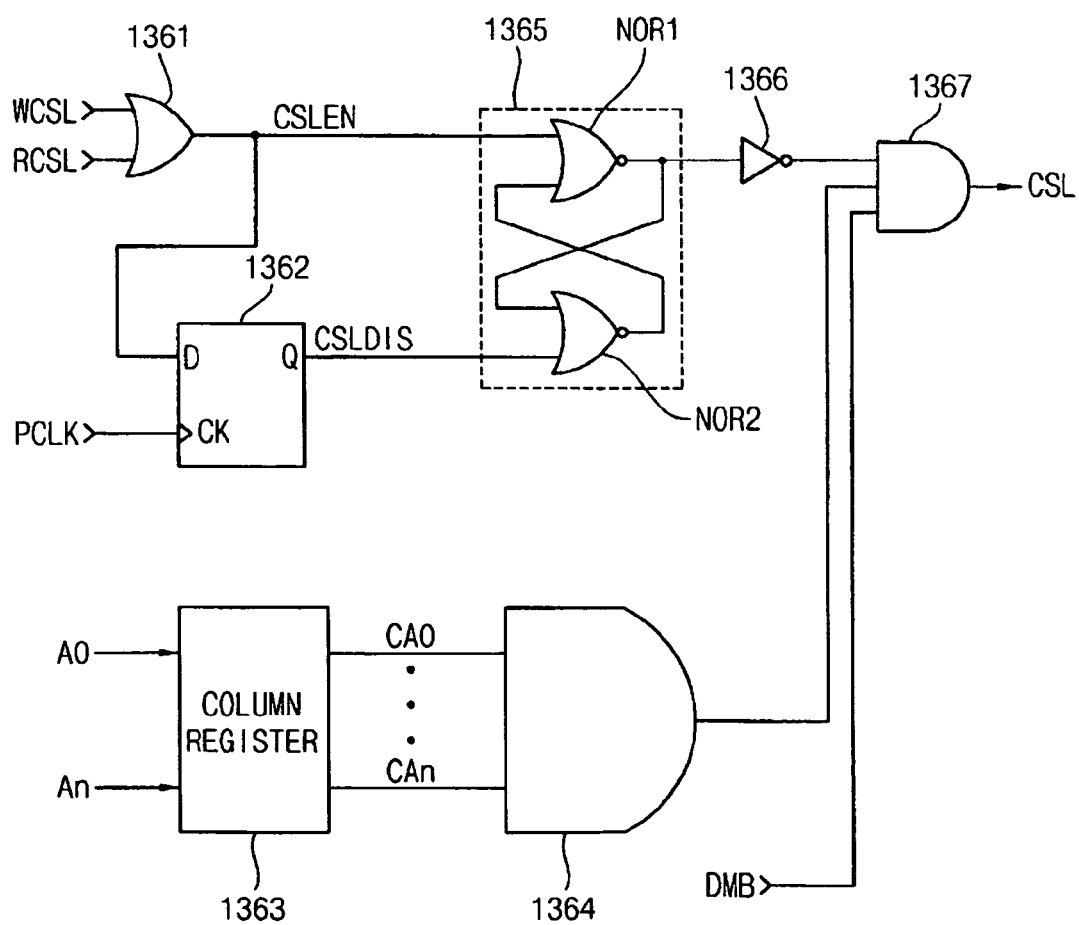
FIG. 14 illustrates a circuit diagram of a column controller in the control signal generating circuit of FIG. 4.

FIG. 14 illustrates a circuit diagram of the column controller 1360 in the control signal generating circuit 1300 of FIG. 4. Referring to FIG. 14, the column controller 1360 may include a ninth OR gate 1361, a fourteenth flip-flop 1362, a column register 1363, a third AND gate 1364, a first latch circuit 1365, a third inverter 1366, and a fourth AND gate 1367. The first latch circuit 1365 may include a second NOR gate NOR1 and a third NOR gate NOR2.

The ninth OR gate 1361 may perform an OR operation on the write column selection signal WCSL and the read column selection signal RCSL, and may generate the column selection enable signal CSLEN. The fourteenth flip-flop 1362 may perform a gating operation on the column selection enable signal CSLEN in response to the internal clock signal PCLK and may generate the column selection disable signal CSLDIS. The column register 1363 may generate column address signals CA0 and CAn based on address signals A0 and An. The third AND gate 1364 may perform an AND operation on the column address signals CA0 and CAn. The first latch circuit 1365 may be enabled in response to the column selection enable signal CSLEN and may be disabled in response to the column selection disable signal CSLDIS. The first latch circuit 1365 may output a signal having a first level in response to the column selection enable signal CSLEN and having a second level in response to the column selection disable signal CSLDIS. The first level may be "0" state and the second level may be "1" state. The third inverter 1366 may invert an output signal of the third inverter 1366. The fourth AND gate 1367 may perform an AND operation on an output signal of the third inverter 1366, an output signal of the third AND gate 1364, and the second data masking signal DMB to generate the column selection signal CSL.

As illustrated in FIG. 14, the column selection signal CSL may be enabled when the second data masking signal DMB is enabled, an output signal generated by performing AND operation on the column address signals CA0 and CAn is logic "high" state. Furthermore, the column selection signal CSL may be enabled in response to the column selection enable signal CSLEN and disabled in response to the column selection disable signal CSLDIS.

Figure 15:
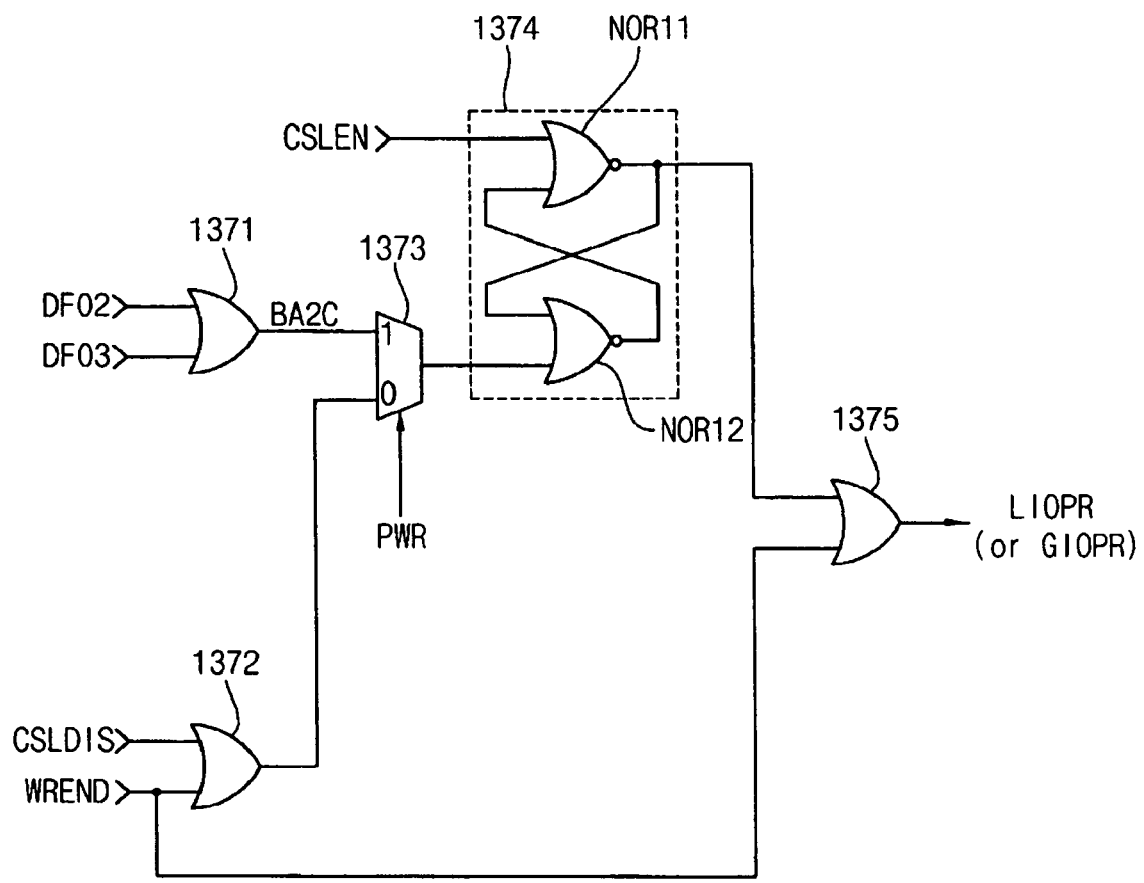
FIG. 15 illustrates a circuit diagram of a pre-charge control signal generating circuit in the control signal generating circuit of FIG. 4.

FIG. 15 illustrates a circuit diagram of the a pre-charge control signal generating circuit 1370 in the control signal generating circuit 1300 of FIG. 4 according to an embodiment. Referring to FIG. 15, the pre-charge control signal generating circuit 1370 may include a tenth OR gate 1371, an eleventh OR gate 1372, a third multiplexer 1373, a second latch circuit 1374 and a twelfth OR gate 1375. The second latch circuit 1374 includes a fourth NOR gate NOR 11, and a fifth NOR gate NOR 12.

The tenth OR gate 1371 may perform an OR operation on the ninth gating signal DF02 and the tenth gating signal DF03, and may generate a bank write signal BA2C. The eleventh OR gate 1372 may perform an OR operation on the column selection disable signal CSLDIS and the write end signal WREND. The third multiplexer 1373 may select one of the bank write signal BA2C and an output signal of the eleventh OR gate 1372 in response to the write range signal PWR. The second latch circuit 1374 may be enabled in response to the column selection enable signal CSLEN and may be disabled in response to an output signal of the third multiplexer 1373. The second latch circuit 1374 may output a signal having a third level in response to the column selection enable signal CSLEN and having a fourth level in response to the output signal of the third multiplexer 1373. The third level may be "0" state and the fourth level may be "1" state. The twelfth OR gate 1375 may perform an OR operation on an output signal of the second latch circuit 1374 and the write end signal WREND, and may generate the local pre-charge control signal LIOPR or the global pre-charge control signal GIOPR.

Hereinafter, an operation of the pre-charge control signal generating circuit 1370 is described in accordance with an implementation.

The local pre-charge control signal LIOPR or the global pre-charge control signal GIOPR may be enabled when the write end signal WREND is logic "high" state or the output signal of the second latch circuit 1374 is logic "high" state.

When the write range signal PWR is logic "high" state, i.e., the semiconductor memory device 1000 is operated in a write mode, the third multiplexer 1373 may output the bank write signal BA2C generated by performing OR operation on the ninth and tenth gating signals DF02 and DF03.

When the output signal of the third multiplexer 1373 is logic "1" state and the column selection enable signal CSLEN is logic "high" state, the output signal of the second latch circuit 1374 is logic "low" state. Neither the local pre-charge control signal LIOPR nor the global pre-charge control signal GIOPR is enabled when the write end signal WREND is logic "low" state and the output of the second latch circuit 1374 is logic "low" state.

When the output signal of the third multiplexer 1373 is logic "1" state and the column selection enable signal CSLEN is logic "low" state, the output signal of the second latch circuit 1374 is logic "high" state. The local pre-charge control signal LIOPR or the global pre-charge control signal GIOPR is enabled even though the write end signal WREND is logic "low" state.

When the write range signal PWR is logic "0" state, e.g., the semiconductor memory device 1000 is operated in a read mode, the third multiplexer 1373 may output the column selection disable signal CSLDIS or the write end signal WREND.

When the column selection disable signal CSLDIS is logic "high" state, the column selection enable signal CSLEN is logic "low" state, and the output signal of the second latch circuit 1374 is logic "high" state. Therefore, the local pre-charge control signal LIOPR or the global pre-charge control signal GIOPR is enabled even though the write end signal WREND is logic "low" state.

Figure 16:
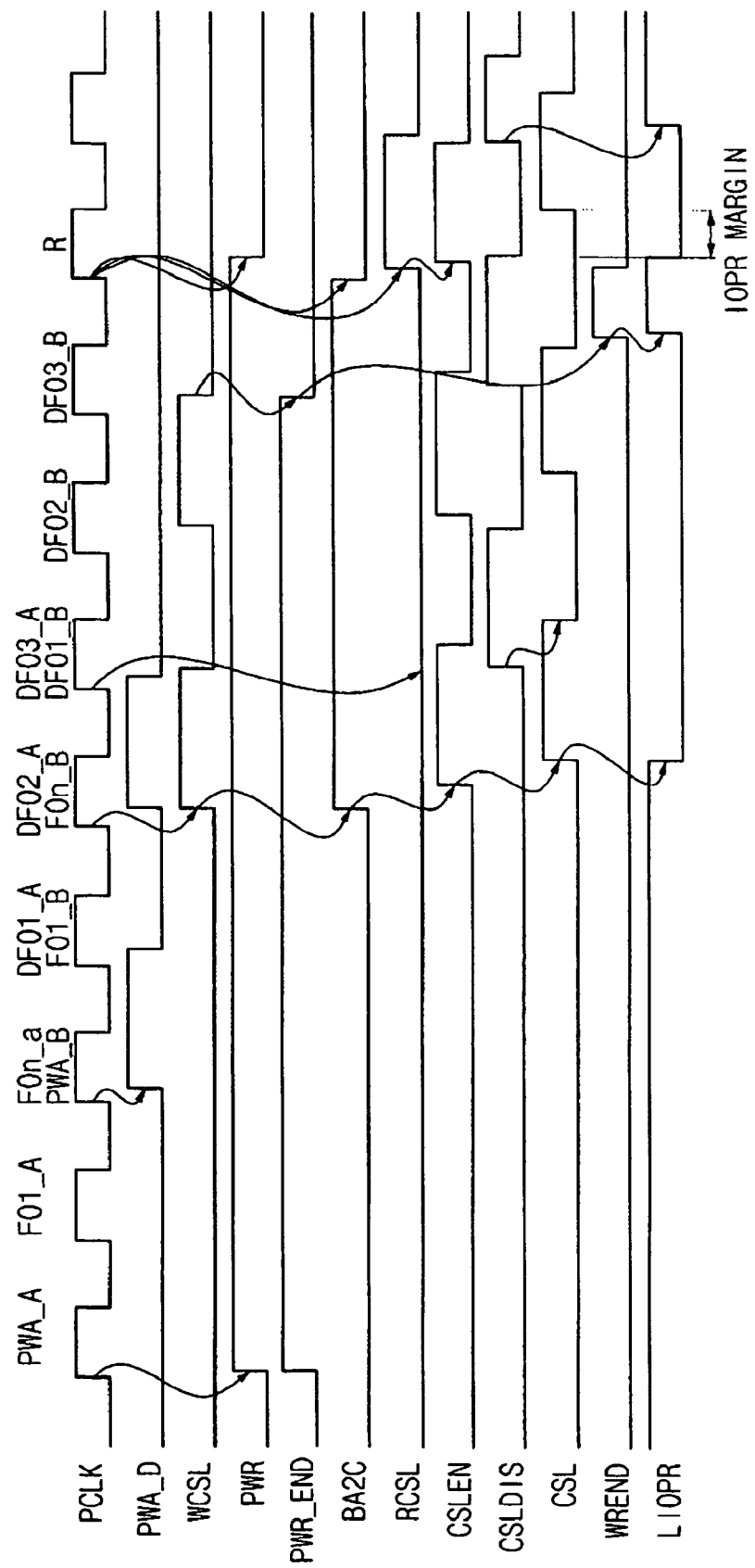
FIG. 16 and FIG. 17 illustrate timing diagrams of an operation of the semiconductor memory device in FIG. 1.
Figure 17:
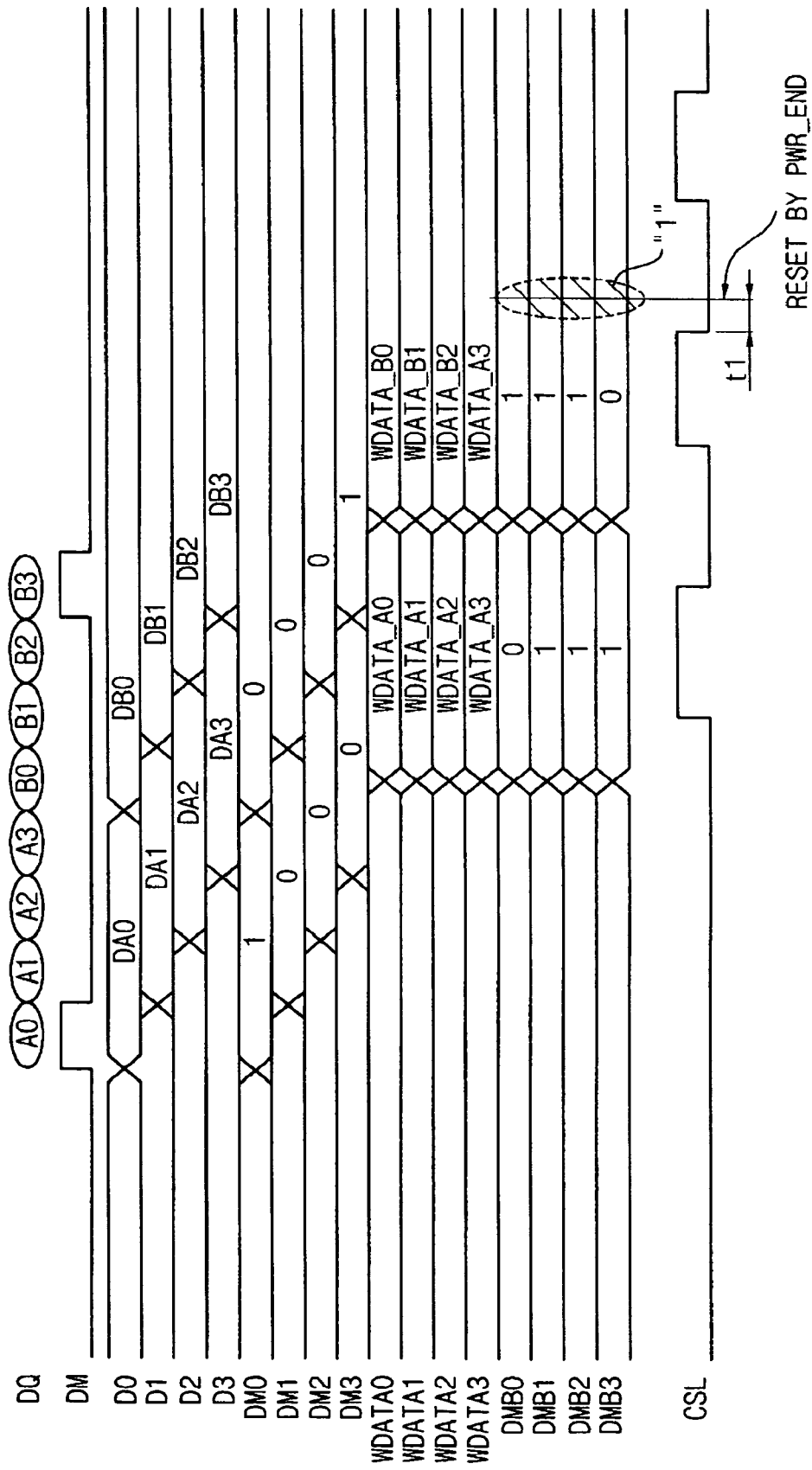

FIG. 16 and FIG. 17 illustrate timing diagrams of an operation of the semiconductor memory device 1000 in FIG. 1 in accordance with an embodiment. In a particular implementation, FIG. 16 and FIG. 17 illustrate an operation of the semiconductor memory device in FIG. 1 when the write latency is "2" (WL=2), the burst length is "4" (BL=4), and a clock cycle between the write mode and the read mode is "2" (tWTR=2).

In FIG. 16, PWA_A represents a first write command signal, F01_A represents an output signal of the first flip-flop FF1 in a first write mode, and F0n_A represents an output signal of an nth flip-flop in the first write mode. In a particular example of FIG. 16, when the write latency (WL) is "2", F0n_A is F02_A, where F02_A is the output signal of the second flip-flop. DF01_A represents an output signal of the eighth flip-flop FF8 in the first write mode. DF02_A represents an output signal of the ninth flip-flop FF9 in the first write mode. DF03_A represents an output signal of the tenth flip-flop FF10 in the first write mode.

PWA_B represents a second write command signal, F01_B represents an output signal of the first flip-flop FF1 in a second write mode, and F0n_B represents an output signal of the nth flip-flop in the second write mode. In a particular example of FIG. 16, when the write latency (WL) is "2", F0n_B is F02_B, where F02_B is the output signal of the second flip-flop. DF01_B represents an output signal of the eighth flip-flop FF8 in the second write mode, DF02_B represents an output signal of the ninth flip-flop FF9 in the second write mode, and DF03_A represents an output signal of the tenth flip-flop FF10 in the second write mode.

In FIG. 17, DA0, DA1, and DA2 represent bits written to the semiconductor memory device 1000 in the first write mode, and DB0, DB1, DB2, and DB3 represent bits written to the semiconductor memory device 1000 in the second write mode. DM0, DM1, DM2, and DM3 represent bits of the first data masking signal DM, and DMB0, DMB1, DMB2, and DMB3 represent bits of the second data masking signal DMB. WDATA_A0, WDATA_A1, WDATA_A2, and WDATA_A3 represent bits of write data WDATA in the first write mode, and WDATA_B0, WDATA_B1, WDATA_B2 and WDATA_B3 represent bits of write data WDATA in the second write mode. The write data WDATA may be output signal from the input buffer 1270 in FIG. 3.

Hereinafter, an operation of the semiconductor memory device 1000 is described with reference to FIGS. 1 through 17 in accordance with an implementation.

The input/output path circuit 1200 in the semiconductor memory device 1000 may perform the input/output line pre-charge operation and the data masking reset operation at the write end time point, and may output the data stored in the memory cell array 1100 when the semiconductor memory device 1000 is operated in the read mode. The control signal generating circuit 1300 may generate the write end signal WREND corresponding to the write end time point and may generate the local pre-charge control signal LIOPR, the global pre-charge control signal GIOPR, and the column selection signal CSL based on the write end signal WREND, the column selection enable signal CSLEN, and column selection disable signal CSLDIS.

As illustrated in FIG. 16, the write end signal WREND representing the write end time point may be generated in synchronization with the write column selection signal WCSL. The semiconductor memory device 1000 may pre-charge the local input/output lines LIO1 and LIO1B, and the global input/output lines GIO1 and GIO1B, at the write end time point, not between the first write mode and the second write mode. Therefore, the semiconductor memory device 1000 may decrease power consumption.

Furthermore, by synchronizing the write end signal WREND with the write column selection signal WCSL, the semiconductor memory device 1000 may pre-charge the local input/output lines LIO1 and LIO1B, and the global input/output lines GIO1 and GIO1B, up to about one clock cycle before the semiconductor memory device 1000 is in the read mode. Therefore, an input/output pre-charge margin IOPR MARGIN may be provided, as illustrated in FIG. 16.

Referring to FIGS. 16 and 17, each bit of the second data masking signal DMB is logic "1" state after a predetermined short time t1 from a falling edge time of the column selection signal CSL in response to the write end signal WREND. When the second data masking signal DMB is enabled, a data masking operation is not performed at the next read operation.

As described above, the semiconductor memory device 1000 according to some example embodiments may perform the data masking reset operation at the write end time point and thus a delay time between the sequential data masking reset operations may be reduced. In addition, a delay time between the falling edge of the column selection signal CSL and a data masking resetting may be reduced. Furthermore, the semiconductor memory device 1000 according to some example embodiments may decrease power consumption because the semiconductor memory device 1000 performs the data masking reset operation at the write end time point and does not perform the data masking reset operation between write operations. Therefore, the semiconductor memory device 1000 according to some example embodiments may decrease a time between the write mode and the read mode (tWTR), and the semiconductor memory device 1000 may be operated at high speed because the semiconductor memory device 1000 may accurately reflect the write end time point.

The semiconductor memory device 1000 may be a semiconductor memory device, e.g., a DRAM, requiring the pre-charge operation or the data masking operation.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device, comprising:
   a memory cell array; and
   an input/output path circuit configured to perform an input/output line pre-charge operation at a write end time point and to output data stored in the memory cell array when the semiconductor memory device is operated in a read mode,
   wherein the input/output path circuit is configured to perform a data masking reset operation at the write end time point.

2. The semiconductor memory device as claimed in claim 1, wherein the input/output path circuit includes:
   a column selection circuit configured to connect each of a plurality of bit line pairs to each of a plurality of local input/output line pairs in response to a column selection signal;
   a local pre-charge circuit configured to pre-charge the local input/output line pairs to a first voltage level in response to a local pre-charge control signal;
   a multiplexer configured to selectively connect the local input/output line pairs to a global input/output line pair; and a global pre-charge circuit configured to pre-charge the global input/output line pair to a second voltage level in response to a global pre-charge control signal.

3. The semiconductor memory device as claimed in claim 2, wherein the input/output path circuit further includes:
an input driver configured to drive the global input/output line pair in response to write data; and
an output sense amplifier configured to amplify data of the global input/output line pair to generate read data.

4. The semiconductor memory device as claimed in claim 2, further comprising:
a control signal generating circuit configured to generate a write end signal corresponding to the write end time point in response to a write column selection signal, and to generate a pre-charge control signal based on the write end signal, a column selection enable signal, and a column selection disable signal.

5. The semiconductor memory device as claimed in claim 4, wherein the control signal generating circuit includes:
a write latency controller configured to generate the write column selection signal and a plurality of gating signals based on a write command signal, a write latency control signal, and an internal clock signal;
a write range controller configured to generate a write range signal based on the write command signal, the gating signals, and a burst length information signal;
a write end signal generating circuit configured to generate a write end control signal and the write end signal based on the write command signal, the gating signals, and the burst length information signal;
a data masking controller configured to generate an internal data masking signal based on an external data masking signal, the write column selection signal, and the write end control signal;
a column controller configured to generate a column selection signal, the column selection enable signal, and the column selection disable signal based on the internal clock signal, address signals, a read column selection signal, the write column selection signal, and the internal data masking signal; and
a pre-charge control signal generating circuit configured to generate the pre-charge control signal based on the write range signal, the write end signal, the column selection enable signal, and the column selection disable signal.

6. The semiconductor memory device as claimed in claim 5, wherein the burst length information signal is enabled when a burst length corresponds to eight and the burst length information signal is disabled when the burst length does not correspond to eight.

7. The semiconductor memory device as claimed in claim 6, wherein the write column selection signal is equal to the ninth gating signal and the write column selection signal is generated by further delaying the delayed write command signal according to a burst length.

8. The semiconductor memory device as claimed in claim 5, wherein the write latency controller includes:
a write latency counter configured to delay the write command signal in response to the internal clock signal and the write latency control signal, and to generate a delayed write command signal and first through seventh gating signals;
a burst length counter configured to further delay the delayed write command signal in response to the internal clock signal to generate an eighth gating signal, a ninth gating signal, and the write column selection signal; and a delay circuit configured to delay the write column selection signal for a predetermined time to generate a tenth gating signal, an eleventh gating signal, and a twelfth gating signal.

9. The semiconductor memory device as claimed in claim 5, wherein the write range controller includes:
a first OR gate that performs an OR operation on the write command signal and the first through seventh gating signals;
a second OR gate that performs an OR operation on the eighth through tenth gating signals;
a third OR gate that performs an OR operation on the eleventh and twelfth gating signals;
an AND gate that performs an AND operation on an output signal of the third OR gate and the burst length information signal; and
a fourth OR gate that performs an OR operation on an output signal of the first OR gate, an output signal of the second OR gate, and an output signal of the AND gate to generate the write range signal.

10. The semiconductor memory device as claimed in claim 5, wherein the write end signal generating circuit includes:
a logical operation circuit configured to perform a logical operation on the write command signal, the first through eleventh gating signals, and the burst length information signal to generate the write end control signal; and
an auto pulse generating circuit configured to generate the write end signal in response to the write end control signal, the write end signal being a pulse signal.

11. The semiconductor memory device as claimed in claim 10, wherein the logical operation circuit includes:
a first OR gate that performs an OR operation on the write command signal and the first through seventh gating signals;
a second OR gate that performs an OR operation on the eighth and ninth gating signals;
a third OR gate that performs an OR operation on the tenth and eleventh gating signals;
an AND gate that performs an AND operation on an output signal of the third OR gate and the burst length information signal; and
a fourth OR gate that performs an OR operation on an output signal of the first OR gate, an output signal of the second OR gate, and an output signal of the AND gate to generate the write end control signal.

12. The semiconductor memory device as claimed in claim 10, wherein the auto pulse generating circuit includes:
a delay circuit configured to delay the write end control signal;
an inverter configured to invert an output signal of the delay circuit; and
a NOR gate that performs a NOR operation on the write end control signal and an output signal of the inverter to generate the write end signal.

13. The semiconductor memory device as claimed in claim 12, wherein the write end signal is generated in accordance with the write end control signal, the write end signal having a pulse width corresponding to a delay time of the delay circuit.

14. The semiconductor memory device as claimed in claim 12, wherein the data masking controller includes a flip-flop that performs a gating operation on the external data masking signal to output the internal data masking signal through an inversion output terminal, and the data masking controller is reset in response to the write end control signal.

15. The semiconductor memory device as claimed in claim 5, wherein the column controller includes:

an OR gate that performs an OR operation on the write column selection signal and the read column selection signal to generate the column selection enable signal;

a flip-flop that performs a gating operation on the column selection enable signal in response to the internal clock signal to generate the column selection disable signal;

a latch circuit enabled in response to the column selection enable signal and disabled in response to the column selection disable signal;

an inverter that inverts an output signal of the latch circuit;

a first AND gate that performs an AND operation on column address signals; and a second AND gate that performs an AND operation on an output signal of the inverter, an output signal of the first AND gate, and the internal data masking signal to generate the column selection signal.

16. The semiconductor memory device as claimed in claim 5, wherein the pre-charge control signal generating circuit includes:

a first OR gate that performs an OR operation on the column selection disable signal and the write end signal;

a multiplexer that selectively outputs one of a bank write signal and an output signal of the first OR gate in response to the write range signal;

a latch circuit enabled in response to the column selection enable signal and disabled in response to an output signal of the multiplexer; and a second OR gate that performs an OR operation on an output signal of the latch circuit and the write end signal to generate the local pre-charge control signal or the global pre-charge control signal.

17. An input/output control signal generating circuit, the circuit comprising:

a write latency controller configured to generate a write column selection signal and a plurality of gating signals based on a write command signal, a write latency control signal, and an internal clock signal;

a write range controller configured to generate a write range signal based on the write command signal, the gating signals, and a burst length information signal;

a write end signal generating circuit configured to generate a write end control signal and a write end signal based on the write command signal, the gating signals, and the burst length information signal;

a data masking controller configured to generate an internal data masking signal based on an external data masking signal, the write column selection signal, and the write end control signal;

a column controller configured to generate a column selection signal, a column selection enable signal and a column selection disable signal based on the internal clock signal, address signals, a read column selection signal, the write column selection signal, and the internal data masking signal; and a pre-charge control signal generating circuit configured to generate a pre-charge control signal based on the write range signal, the write end signal, the column selection enable signal, and the column selection disable signal.

18. A method of inputting and outputting data in a semiconductor memory device, the method comprising:

performing an input/output line pre-charge operation at a write end time point;

outputting data stored in a memory cell array when the semiconductor memory device is operated in a read mode; and performing a data masking reset operation at the write end time point.

* * * * *